United States Patent [19]

Nishiura

[11] Patent Number: 5,241,264
[45] Date of Patent: Aug. 31, 1993

[54] IC TEST APPARATUS

[75] Inventor: Junji Nishiura, Gyoda, Japan

[73] Assignee: Advantest Corporation, Tokyo, Japan

[21] Appl. No.: 881,668

[22] Filed: May 12, 1992

[30] Foreign Application Priority Data

May 15, 1991 [JP] Japan .................................. 3-110483

[51] Int. Cl.$^5$ .......................................... G01R 31/28
[52] U.S. Cl. ................................ 324/158 R; 371/22.1
[58] Field of Search .......................... 324/73.1, 158 R; 371/22.1, 22.6, 25.1, 27; 307/473, 475

[56] References Cited

U.S. PATENT DOCUMENTS

| 4,236,246 | 11/1980 | Skilling | 371/25.1 |
|---|---|---|---|
| 4,348,759 | 9/1982 | Schnurmann | 371/22.1 |
| 4,523,312 | 6/1985 | Takeuchi | 324/25.1 |
| 4,571,724 | 2/1986 | Belmondo et al. | 371/27 |
| 4,583,223 | 4/1986 | Inoue et al. | 324/73.1 |
| 4,637,020 | 1/1987 | Schinabeck | 371/22.1 |
| 4,651,088 | 3/1987 | Sawada | 371/22.1 |
| 4,743,842 | 5/1988 | Langone et al. | 371/22.1 |
| 4,814,638 | 3/1989 | Weick | 307/473 |
| 4,908,576 | 3/1990 | Jackson | 324/73.1 |
| 5,101,153 | 3/1992 | Morong, III | 324/73.1 |

Primary Examiner—Ernest F. Karlsen
Attorney, Agent, or Firm—Staas & Halsey

[57] ABSTRACT

The output of a tri-state driver is connected with I/O pins of test IC elements via load resistors. The I/O pins are connected to the input terminals of corresponding comparators. Under the state where the I/O control signal given to the driver indicates an input condition, the driver generates either the first or the second level corresponding to the logic level of input test pattern data. Under the state where the I/O control signal indicates an output condition, the driver generates the third level which is different from the first and the second level.

1 Claim, 2 Drawing Sheets

IC TEST APPARATUS

BACKGROUND OF THE INVENTION

This invention relates to an IC test apparatus wherein the output from a driver drives input and output (referred to simply as "I/O" hereinafter) pins of IC elements to be tested (referred to simply as "test IC elements" hereinafter) and wherein the output signals from individual I/O pins are sent to separate comparators.

Since testing of a large IC element requires a long time, simultaneous testing of more than one IC element is often considered from the standpoint of efficiency. For example, to test the memory IC element pins exclusive for input use, one driver is employed to drive each input pin of every one of the total 128 memory IC elements on a board. This testing system tests 128 elements at a time, thereby reducing the test time equivalent to one hundred and twenty eighth.

The conventional system described above is, however, not applicable to IC elements having pins for both input and output use. Referring to FIG. 1, even when the I/O status of an IC element is controlled at I/O pin by sending I/O signal IOD to more than one test IC element $12_l \sim 12_n$ n so that a test pattern data may be provided from one driver 11 to the input of individual I/O pins corresponding to the test IC elements $12_l \sim 12_n$ and the outputs at individual I/O pins may be supplied to individual comparators $13_l \sim 13_n$ corresponding to each of the test IC elements $12_l \sim 12_n$, the separate comparison of output from individual IC elements $12_l \sim 12_n$ would be impossible because all the I/O pins on the test IC elements $12_l \sim 12_n$ are interconnected.

Therefore, a prior art carried the simultaneous testing of these test IC elements $12_l \sim 12_n$ by setting separate pairs of driver and comparator for each test IC element of $12_l \sim 12_n$ and by giving the same test pattern to the same pin number on different IC elements each time.

Alternatively, a prior art carried out testing of IC elements one at a time, as illustrated in FIG. 2, by connecting the I/O pins of the same pin number on test IC elements $12_l \sim 12_n$ with the output of common driver 11 and the input of common comparator 13 and by controlling separately the chip selection terminal CS on the test IC elements $12_l \sim 12_n$ using the corresponding drivers $14_l \sim 14_n$ and by sequentially setting the test IC elements $12_l \sim 12_n$ to the enable state.

When every I/O pin of each test IC element is connected to an independent driver-comparator pair, the time required for the simultaneous testing of 128 IC elements, for example, will be shortened to one hundred and twenty eighth of the time needed for sequential testing. However, this system requires numerous drivers. For instance, 512 drivers are needed to test 128 IC elements having a 4M×4 memory capacity. Thus, a serious problem is raised if the hardware scale is enlarged significantly. Furthermore, the system shown in FIG. 2 can not shorten the test time.

SUMMARY OF THE INVENTION

The object of this invention is to provide an IC test apparatus capable of applying predetermined test pattern data to I/O pins of IC elements from one driver following an I/O control signal and then sending the subsequent response outputs from the I/O pins to corresponding comparators.

According to this invention, the output terminal of one driver is connected to each of the corresponding I/O pins of test IC elements via independent loads. The driver accepts test pattern data and I/O determination data which select the condition either to input or output. When the condition is selected to input to the test IC elements, or when the I/O determination data indicates an input condition, the driver generates either one of two levels, corresponding to the test pattern. When the condition is selected to output to the test IC elements, or when the I/O determination data indicates an output condition, the driver generates a third level which is different from the two levels described above. The loads act as a load against the test IC element. The I/O pins of test IC elements are connected to input terminals of independent comparators enabling the acceptance of individual outputs separately.

DETAILED DESCRIPTION OF THE PREFERRED EMBODIMENTS

Figure 1:
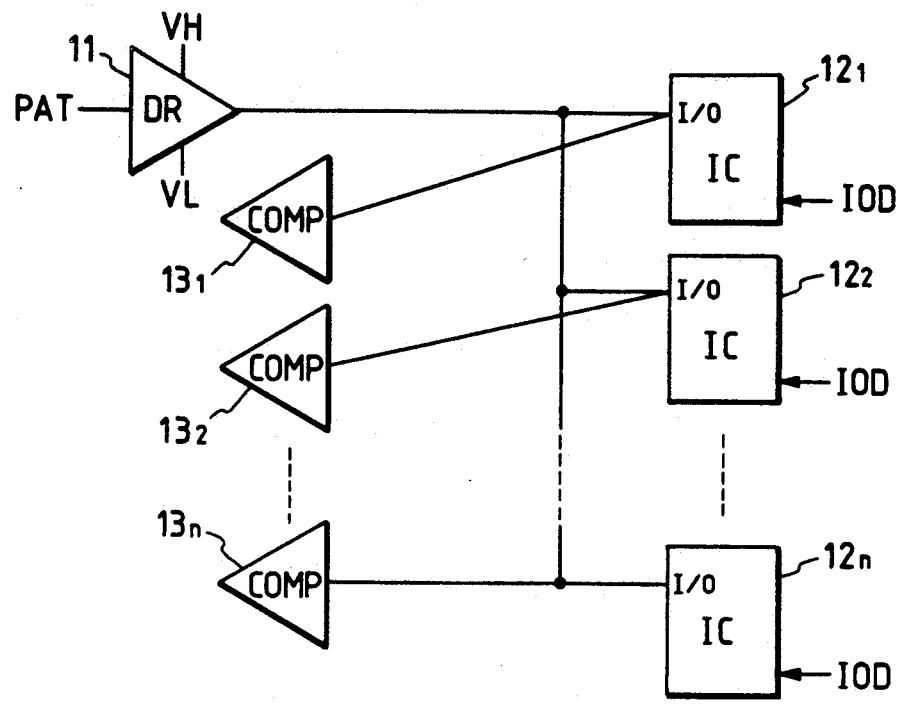
FIG. 1 is a block diagram showing that a simultaneous test of IC elements by a direct drive system is impossible.
Figure 2:
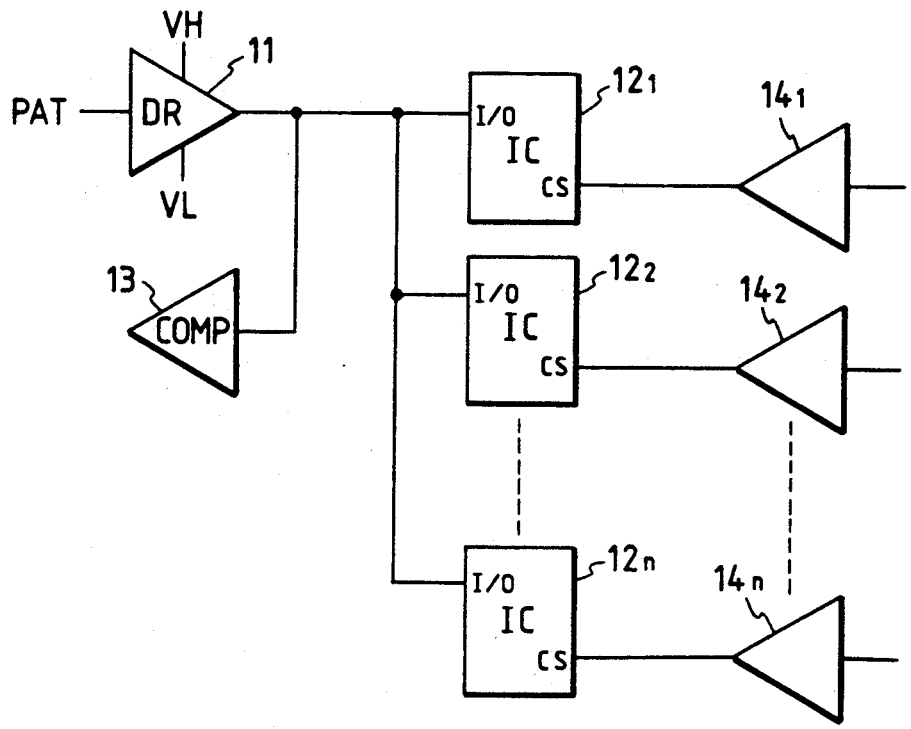
FIG. 2 is a block diagram showing a prior art using a common driver and comparator pair for test IC elements.
Figure 3:
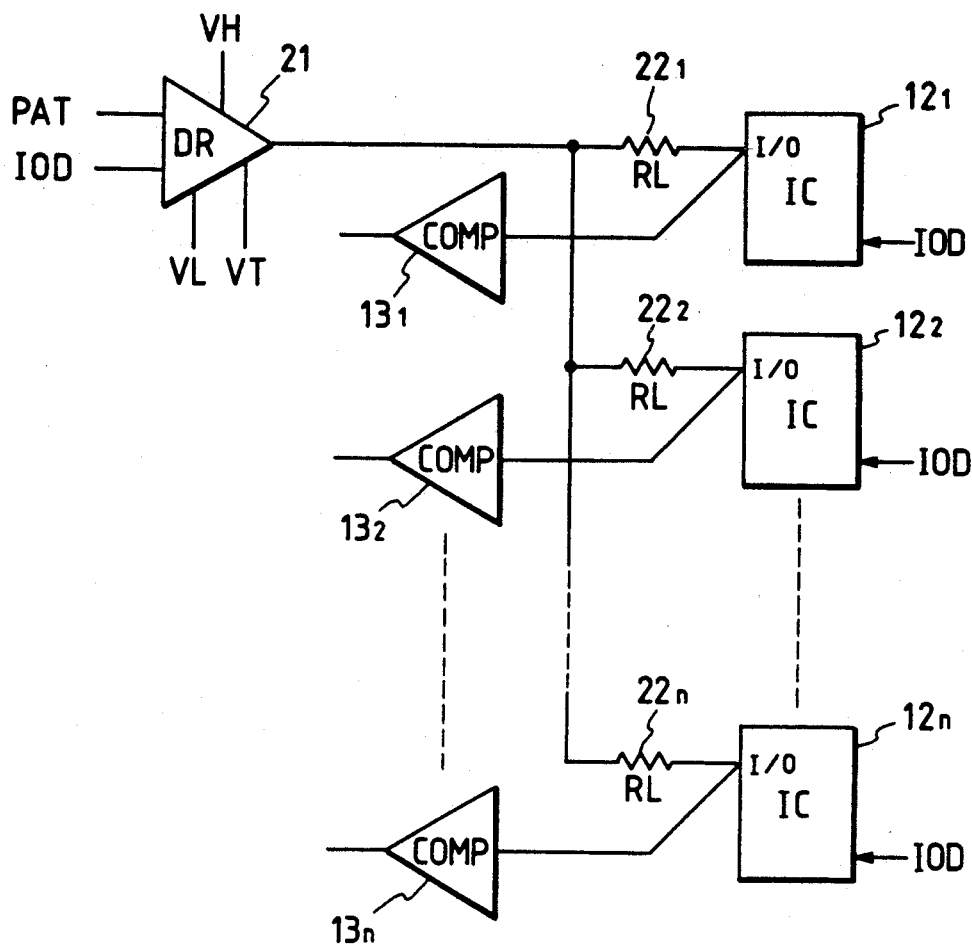
FIG. 3 is a block diagram showing the core part of a preferred embodiment of this invention.

FIG. 3 shows the core part of a preferred embodiment of this invention. The system of this invention comprises the connection of output terminal of the driver 21 with the I/O pins of test IC elements $12_l \sim 12_n$ via the corresponding loads $22_l \sim 22_n$. The individual I/O pins of the test IC elements $12_l \sim 12_n$ are connected to the input terminals of separate comparators $13_l \sim 13_n$.

The driver 21 is a tri-state driver which is applied with three levels of power source, namely the high level voltage VH, the low level voltage VL, and the third level voltage VT. Other than the test pattern data PAT, the I/O control signal IOD, which determines the condition either to input or output, is entered as an input to the driver 21. When the I/O control signal IOD indicates an input condition (for instance, at the low level), the driver 21 generates the high level VH at "1" in the test pattern data PAT, and it generates the low level VL at "0" in the test pattern data PAT. When the I/O control signal IOD indicates an output condition (at the high level), the driver 21 generates the third level VT. Such a tri-state driver is commercially available with TTL or ECL circuits. The loads $22_l \sim 22_n$ act as loads for individual test IC elements $12_l \sim 12_n$.

When the output voltage and output current of the test IC elements 12 are determined, the resistance of loads 22 and the third level voltage VT are defined. In other words, the standard of Vh and current Ih of the test IC elements 12 at the high level output and of the output voltage Vl and current Il at the low level determine the third level voltage VT and the resistance RL of loads 22. For example, if the I/O circuit comprises a TTL circuit, then the standard of the high output level and the low output level are Vh=2.4V, Ih=−5mA, and Vl=0.4V, Il=4.2mA. Consequently, from the condition to make current Il flow at the high level output Vh:

$$VT = 2.4V - RL \times 5mA$$

and from the condition to make current Il to flow at the low level output Vl:

$$VT = 0.4V + RL \times 4.2mA.$$

Figure 4:
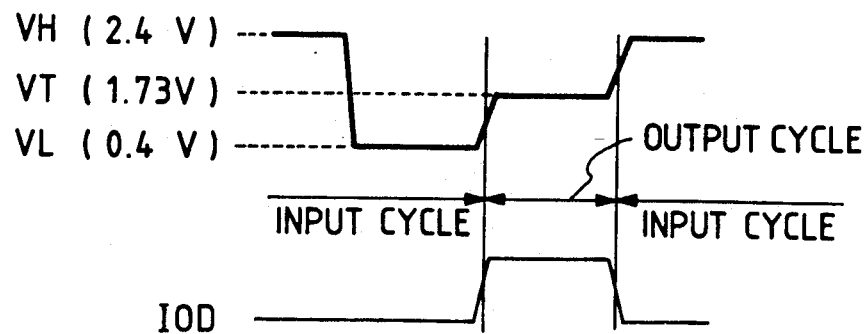
FIG. 4 is an example of output profile of driver 21.

VT=1.315V and RL=217Ω are obtained. If the output circuit of the driver 21 is also configured with TTL, and if VH=2.4V and VL=0.4V, then the profile of output from the driver against I/O control signal IOD becomes the one shown in FIG. 4.

According to the configuration shown in FIG. 3, a test pattern data can be supplied from the common driver 21 to I/O pins of test IC elements $12_l \sim 12_n$. During the reception of the output from I/O pins, the I/O control signal is set to a logic indicating the output condition, and the output from the driver 21 becomes the third level VT, so the I/O pins of test IC elements $12_l \sim 12_n$ connect with the third level VT potential point via the corresponding loads $22_l \sim 22_n$, which results in a network Configuration allowing rated amounts of currents to flow through individual loads $22_l \sim 22_n$ in accordance with high level or low level outputs of the corresponding elements $12_l \sim 12_n$. This configuration allows separate testing Of the level of each I/O pin of individual IC elements $12_l \sim 12_n$ by separately accepting the level to each of the comparators $13_l \sim 13_n$.

As described above, this invention applies a test pattern data simultaneously from one driver to the I/O pins of test IC elements via separate loads, and the comparators corresponding to individual test IC elements receive the output of the test IC elements $12_l \sim 12_n$ separately by selecting the output of the driver 21 as the third level VT when the comparators receive the output of the I/O pins and by allowing the rated current to flow to each load 22 at a rate corresponding to the output of test IC elements $12_l \sim 12_n$. Accordingly, this invention does not require mounting of a separate driver for each test IC element. For example, one common driver can drive the pins of the same pin number on 128 test IC elements. Thus, simultaneous testing of IC elements can be carried out in a much shorter time compared to sequential testing of individual IC elements without excessive enlargement of hardware size.

What is claimed is:

1. An IC test apparatus for testing the outputs of I/O pins of IC elements under test by supplying the outputs into separate comparators comprising:

a tri-state driver means, supplied with test pattern data and an I/O control signal to indicate either an input or output condition, for generating either one of two levels, corresponding to said test pattern data, when the I/O control signal indicates the out condition and for generating a third level when the I/O control signal indicates the output condition;

load resistors connected between said I/O pins of the IC elements under test and an output terminal of said tri-state driver, means respectively; and comparators connected to said I/O pins of the IC elements under test, respectively; and wherein the third level generated by said tri-state driver means and a resistance value of each of said load resistors are selected such that, when said tri-state driver generates the third level, the IC elements under test have predetermined load current values at high and low voltage levels produced by the IC elements under test.

* * * * *